United States Patent
Nakagawa et al.

(10) Patent No.: US 7,103,967 B2
(45) Date of Patent: Sep. 12, 2006

(54) CHIP-COMPONENT ACCOMMODATING DEVICE AND EXAMINING APPARATUS HAVING THE SAME

(75) Inventors: Junichi Nakagawa, Osaka (JP); Yuuji Inoue, Kanagawa (JP)

(73) Assignees: Ricoh Company, Ltd., Tokyo (JP); FAT Corporation, Kanagawa (JP); PALMEC Inc., Tokyo (JP)

( * ) Notice: Subject to any disclaimer, the term of this patent is extended or adjusted under 35 U.S.C. 154(b) by 556 days.

(21) Appl. No.: 10/334,364

(22) Filed: Dec. 31, 2002

(65) Prior Publication Data
US 2003/0155646 A1    Aug. 21, 2003

(30) Foreign Application Priority Data
Jan. 7, 2002    (JP)    ............... 2002-000898

(51) Int. Cl.
*B23P 19/00*    (2006.01)
(52) U.S. Cl. ............... 29/740; 29/739; 29/759; 83/591
(58) Field of Classification Search ......... 29/739, 29/740, 759; 83/591
See application file for complete search history.

(56) References Cited

U.S. PATENT DOCUMENTS 6,594,887 B1 * 7/2003 Okuda et al. ............ 29/739
6,634,159 B1 * 10/2003 Muto et al. ............ 53/591
6,742,675 B1 * 6/2004 Saito et al. ............ 221/200
6,926,797 B1 * 8/2005 Okawa et al. ............ 156/344

FOREIGN PATENT DOCUMENTS

JP    5-81004    11/1993

* cited by examiner

Primary Examiner—Carl J. Arbes
(74) Attorney, Agent, or Firm—Cooper & Dunham LLP

(57) ABSTRACT

According to the present invention, in the field of packaging the chip component, increase in speed and stability in packaging the chip component is achieved without significantly increasing the cost of the device. The size of the suction face of the suction nozzle is set so as to be larger than the relevant chip component. Near the inserting position P of the chip component, a push cover is provided in close proximity to the upper surface of the carrier tape. A hole is provided in the push cover at the inserting position P, and the size of the hole is slightly larger than the size of the tip face of the suction nozzle. After the chip component held to the suction nozzle enters the component-accommodating recess of the carrier tape, the suction of the suction nozzle is released and the carrier tape starts to move in the direction shown with an arrow, orthogonal to the suction nozzle. The suction nozzle is raised after the opening of the component-accommodating recess is completely under the push cover.

18 Claims, 6 Drawing Sheets

CHIP-COMPONENT ACCOMMODATING DEVICE AND EXAMINING APPARATUS HAVING THE SAME

BACKGROUND OF THE INVENTION

This application claims the benefit of Japanese Patent Application No. 2002-000898 filed Jan. 7, 2002 in the Japanese Patent Office, the disclosure of which is hereby incorporated by reference.

1. Field of the Invention

The present invention relates to a chip-component accommodating device for automatically inserting and accommodating a chip component, for example, a compact chip component such as a chip size package (CSP) of a semiconductor device in an embossed carrier tape in a stable state; and to a chip-component examining apparatus provided with the same.

2. Description of the Related Art

After chip components are tested with respect to electrical properties, in the final manufacturing stage, to determine whether there are defects or not, only the non-defective components are packaged into a predetermined package form and then shipped. Such a task is more or less automatically carried out. Presently, for example, the most common way of packaging the chip component is to insert a chip component into one of the embossments of the so-called embossed tape where equally spaced component-accommodating recesses are formed in a line in a carrier tape by embossing, and then to seal it with a covering tape. An automatic packaging device is used for this purpose.

This type of conventional automatic packaging device will be explained briefly with reference to FIG. 6A and FIG. 6B.

A chip component 6 is picked up, through negative pressure, on a tip end of a suction nozzle 8a provided with a suction hole 12, and is carried to a place above a component-accommodating recess 4 of a carrier tape 2 at the inserting position of the chip component (FIG. 6A). At this position, the suction nozzle 8a is lowered until the chip component 6 enters the component-accommodating recess 4 (FIG. 6B). Subsequently, the suction of the suction nozzle 8a is released and the chip component 6 is detached from the suction nozzle 8a. The carrier tape 2 is then moved in the direction shown with an arrow and the suction nozzle 8a is raised. The process then proceeds to the inserting step for the next chip component. Although not shown in the figure, the component-accommodating recess 4 of the carrier tape 2 is covered with a covering tape and then thermo-compression bonded, thereby sealing the chip component 6 inside the component-accommodating recess 4. The carrier tape 2 is then wound to a reel.

However, in regards to the processes of taking suction on the chip component 6 with the suction nozzle 8a, inserting the chip component into the component-accommodating recess 4 of the carrier tape 2 and then releasing suction so as to detach the chip component 6, it takes a long time from the moment when the suction is released to the moment when the chip component 6 is completely detached. Thus, there is a limit of speeding up the packaging, as the intermittent feed of the carrier tape 2 starts after the chip component 6 is completely detached.

If the suction nozzle 8a is raised after the release of suction, but before the negative pressure in the suction hole 12 is completely gone, or if the carrier tape 2 is moved to speed up packaging, problems or disadvantages may arise in that the chip component 6 may fall out of the component-accommodating recess 4, or in that the chip component may be inserted in a wrong position.

An automatic packaging device disclosed in Japanese Laid-Open Utility Model Application 5-81004 is proposed as the automatic packaging device for solving such disadvantages. In this proposed automatic packaging device, a push plate that is lowered in sync with the lowering of the suction nozzle is provided. The push plate is provided with a groove having a width larger than that of the tip of the suction nozzle but smaller than that of the chip component.

In the proposed automatic packaging device, during the operation of accommodating the chip component, the tip of the suction nozzle is placed in the groove of the push plate with the chip component held at the tip, and the suction nozzle and the push plate are lowered synchronously, thus inserting the chip component into the component-accommodating recess. The negative pressure within the suction hole is gradually released while the component-accommodating recess is covered with the push plate, and only the suction nozzle is raised. Here, because the component-accommodating recess is covered with the push plate, the chip component is held down in the component-accommodating recess and thus deviation in the position of the chip component can be prevented.

However, in the automatic packaging device disclosed in the Japanese Laid-Open Utility Model Application 5-81004, a push plate that is lowered in sync with the suction nozzle, as well as a mechanism for driving the push plate, are required, thus causing the device to be larger in size and to be more complex, and furthermore causing the cost of the device to increase.

Furthermore, with respect to the compact chip component having an outside dimension of, for example, 1 mm or less as recently known to be the dimension of the chip size package, the width of the groove of the push plate into which the tip of the suction nozzle is placed must be less than the outside dimension of the chip component, and the tip of the suction nozzle must be smaller than the width of the groove of the push plate. Thus, a high degree of dimensional accuracy and positional accuracy are required for the push plate and the suction nozzle. Furthermore, since the push plate and the suction nozzle are lowered synchronously, a high standard in assembling accuracy of the device is also required, causing the cost of the device to further increase.

SUMMARY OF THE INVENTION

Accordingly, the general object of the present invention is to provide a chip-component inserting and accommodating device that speeds up packaging of the chip component and enhances inserting stability without significantly increasing the cost of the device.

Another object of the present invention is to provide a chip-component examining apparatus provided with the chip-component inserting and accommodating device.

The above object of the present invention is achieved by providing a chip-component accommodating device for intermittently feeding a carrier tape forming a plurality of equally spaced component-accommodating recesses while sequentially inserting chip components into each of the component-accommodating recesses at an inserting position of the chip component, and then after the chip component is inserted, sealing the upper surface of the carrier tape at another position; the device having a suction nozzle, provided with a suction face or a tip face that removably picks up the chip component, for inserting the chip component into the component-accommodating recess, the size of the suction face being greater than the size of the chip component; a transporting mechanism for transporting the suction nozzle to the inserting position of the chip component; and a cover provided in close proximity to the upper surface of the carrier tape near the inserting position of the chip component, the cover having an opening forming part and having a size that covers, together with the suction face of the suction nozzle, the upper part of the component-accommodating recess at the inserting position of the chip component.

Thus, by moving the carrier tape with the upper part of the chip component covered with the tip face of the suction nozzle and the cover, the chip component will not fall out of the component-accommodating recess of the carrier tape or deviate from the normal position even if the carrier tape is moved before the negative pressure of the suction nozzle is completely gone, thus enabling a reliable insertion of the component.

Furthermore, in comparison to the conventional device, it is only necessary to add a cover and there is no need for a high-accuracy component or a sophisticated assembling technique, and increase in the cost of the device can be more or less avoided.

Moreover, after the negative pressure of the suction nozzle is released, there is no need to wait until all of the negative pressure is completely gone to move the carrier tape, thus greatly saving packaging time.

The above object of the present invention is further achieved by providing a chip-component examining apparatus comprising a supplying section for sequentially supplying a chip component to be examined, an examining section for testing electrical properties of the supplied chip component, a packing section for sequentially accommodating the chip component that has undergone the examination, and a mechanism for sequentially transporting the chip component to be examined between each of the sections; wherein the chip-component accommodating device according to the present invention is provided in the packing section.

Thus, in the chip-component examining apparatus, the chip component that has undergone an examination process can be packed securely and rapidly, and the chip-component packing process will not be the bottleneck process controlling the operation speed of the entire examining apparatus.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

[Principle]

Figure 1A:
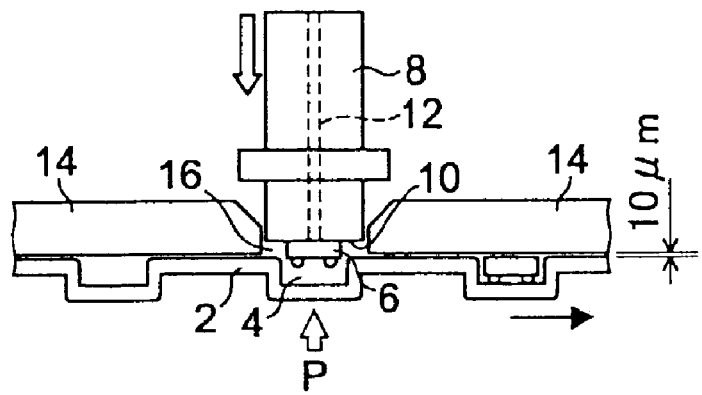
FIG. 1A through FIG. 1D are diagrams showing a main part of a chip-component accommodating device of the present invention in the order of operation thereof.

In the chip-component accommodating device of the present invention, the operation of the suction nozzle, the operation of the transporting mechanism, and the feeding operation of the carrier tape may be mechanically regulated, or a control device may be provided to control timing. By using the control device, the operation of accommodating the chip component can be easily optimized.

An example of a preferred operation of the suction nozzle, the transporting mechanism, and the carrier tape is to start the intermittent feed of the carrier tape in sync with the release of suction by the suction nozzle after the suction nozzle is lowered and the tip thereof enters the opening of the cover thus inserting the chip component into the chip-component accommodating recess.

Thus, the chip component can be reliably inserted into the chip-component accommodating recess.

Furthermore, after the carrier tape starts to be intermittently fed, the suction nozzle is preferably operated so as to rise after the chip-component accommodating recess of the carrier tape passes the opening of the cover.

Thus, even if negative pressure remains in the suction nozzle, the chip component will not rise with the rise of the suction nozzle because the upper part of the chip component inserted into the component-accommodating recess is covered, and thus the chip component can be reliably accommodated in the component-accommodating recess.

The opening of the cover may be of any size as long as the tip face of the suction nozzle can pass through, and may be an opening in which a part thereof is opened, or may be a hole opened in the cover. In the case of a hole, manufacturing can be easily carried out and also the apparatus can be easily assembled.

The opening of the cover preferably has an inclined plane in which the upper edge of the opening widens in the upward direction. Thus, the tip face of the suction nozzle can be easily guided into the component-accommodating recess.

Although the size of the tip face of the suction nozzle is greater than the size of the chip component, the size of the tip face of the suction nozzle can also be set so as to be greater than the size of the opening of the component-accommodating recess, in the traveling direction of the carrier tape. Therefore, even if the suction nozzle is lowered and the tip face thereof contacts the carrier tape, it is possible to insert only the chip component into the component-accommodating recess. Thus it is no longer necessary for a mechanism for lowering the suction nozzle to have a high degree of accuracy, and the manufacturing cost of the chip-component accommodating device is reduced.

One example of transporting the suction nozzle to the inserting position of the chip component is to have displacing means for displacing the suction nozzle to a place above the inserting position of the chip component, and elevating means for moving the suction nozzle upward or downward at the inserting position of the chip component. Such a transporting mechanism is applicable to many fields and is easily achievable.

A plurality of sets of a transporting mechanism and a suction nozzle are provided, and chip components can be sequentially inserted from a plurality of suction nozzles into a series of accommodating recesses formed on the intermittently fed carrier tape. In this case, the number of chip components that can be accommodated per unit time increases, thus increasing the rate of operation.

In the chip-component examining apparatus of the present invention, a mechanism for sequentially transporting the chip component to be examined is provided with a rotor that rotates in a plane, and a suction nozzle that is supported by a rotor so as to be movable in the up-and-down direction and that removably picks up the chip component. Each of the other sections such as a supplying section, an examining section, and a packing section may be arranged along the circumference of the rotor. The mechanism for sequentially transporting the chip component to be examined can be achieved by a rotating mechanism and an elevating mechanism, and thus can be a compact mechanism.

In this case, a plurality of equally spaced suction nozzles are arranged along the circumference of the rotor, and each of the sections such as the supplying section, the examining section, and the packing section can be arranged in one of the equally spaced positions. Here, the number of positions is the same as the number of suction nozzles along the circumference of the rotor. Thus, by rotating the rotor intermittently, processes carried out at the plurality of sections such as the supplying section, the examining section, and the packing section can be carried out simultaneously, thus increasing the rate of the operation.

In this case, the suction nozzle provided on the rotor can also be used as the suction nozzle of the chip-component accommodating device. Therefore, the structure of the chip-component accommodating device can be simplified.

At one of the positions to where the chip component to be examined is transported, a non-defective/defective sorting section is further provided for removing the chip component determined to be defective based on the examination result of the examining section. The packing section is preferably constructed to accommodate only the non-defective chip components to the chip-component accommodating device. Thus, in the chip-component accommodating device accommodating the chip-components that have been examined at the chip-component examining apparatus, only the non-defective chips are accommodated and thus the chip components can be immediately provided to the next step.

At another position to where the chip component to be examined is transported along the circumference of the rotor, an orientation detecting mechanism is provided for detecting the orientation of the chip component picked up by the suction nozzle. At another position to where the suction nozzle is transported along the circumference of the rotor, a correcting mechanism is preferably provided for correcting the orientation of the chip component detected by the orientation detecting mechanism to an orientation suitable for being accommodated to the accommodating recess of the tape carrier. Thus, the accommodation of the chip component to the accommodating recess of the carrier tape is ensured.

An example of the chip component to be examined is a compact chip component having ball terminals on the undersurface thereof. In this case, the suction nozzle picks up the chip component so that the surface with the ball terminal is facing down.

In this case, in one example of the orientation detecting mechanism, the orientation of the chip component is detected based on the position of the ball terminal. Thus the compact chip component, for example, a chip size package, can be properly accommodated in the carrier tape.

If the chip component to be examined is a compact chip component having ball terminals on the undersurface thereof, the examining section is provided with a probe that contacts the ball terminal to examine the electrical properties of the chip component. The position of the ball terminal is detected by the orientation detecting mechanism. A probe position correcting mechanism can be further provided for correcting the position of the probe of the examining section so that the position of the probe corresponds to the position of the detected ball terminal. Therefore, the compact chip component, for example, a chip size package, can be examined properly.

[Embodiment]

FIG. 1A shows the main part of one embodiment of the chip-component accommodating device of the present invention. The chip-component accommodating device accommodates the chip component to the tape carrier formed with accommodating recesses and seals it with a covering tape. This type of chip-component accommodating device is sometimes referred to as a taping unit.

The tape carrier 2 is made of resin and is formed with component-accommodating recesses 4, for accommodating chip components, which recesses are equally spaced apart in a line in the longitudinal direction of the tape carrier. The tape carrier 2 is wound around a reel and supplied therefrom, and is intermittently fed by being unwound from the reel. After accommodating the chip component, the component-accommodating recess 4 is sealed with covering tape, and is subsequently wound to a different reel. A position shown as P is an inserting position for accommodating the chip component, at which position the component-accommodating recess 4 is positioned, the transportation of tape carrier 2 is temporarily stopped, and the chip component 6 is inserted into the component-accommodating recess 4.

A suction nozzle 8 is provided as a mechanism for providing the chip component 6 to the component-accommodating recess 4. The tip face of the suction nozzle 8 is a suction face and thus can removably attach the chip component 6. A suction hole 12 communicating to the suction face 10 of the tip is provided in the suction nozzle 8, and is connected to a suction pump not shown in the figure. Suction by such suction pump can be switched between the suction state and the discharge state through an open-close mechanism such as a solenoid valve. The suction nozzle 8 is cylindrical in shape and the suction face 10 of the tip of the suction nozzle is circular.

The chip component 6 is, for example, a chip size package provided with ball terminals on one surface, and picked up by the suction face 10 on the other surface, or the surface opposite the surface provided with the ball terminals. The size of the suction face 10 is set so as to be greater than the size of the relevant chip component 6. Furthermore, the size of the suction face 10 in the traveling direction of the tape carrier is set so as to be greater than the size of the component-accommodating recess 4 in the traveling direction of the tape carrier.

Near the chip-component accommodating inserting position P, a push cover 14 is provided in close proximity to the upper surface of the tape carrier 2. The push cover 14 is provided with a hole 16 at the inserting position P, and the size of the hole 16 is slightly larger than the size of the tip face 10 of the suction nozzle 8. In other words, the push cover 14 and the tip face of the suction nozzle 8 together cover the upper part of the component-accommodating recess 4 of the tape carrier.

The hole 16 is of a circular shape that surrounds the tip of the suction nozzle 8, but does not necessarily have to be a hole and can be made, for example, of two members that sandwich the tip face of the suction nozzle 8 from the front and the back of the suction nozzle 8 with respect to the traveling direction of the carrier tape. An opening formed by the two members of the push cover, together with the tip face 10 of the suction nozzle 8, only need to cover the upper part of the component-accommodating recess 4 over the range of the width of the component-accommodating recess 4 (the width in the horizontal direction of the figure), and the push cover 14 does not need to be present in the region beyond the width of the component-accommodating recess 4.

If the opening of the push cover 14 is, for example, a hole 16 as shown in the embodiment, the device can be easily assembled and the gap formed with the tape carrier 2 can be easily maintained.

The edge on the upper side of the hole 16 is tapered so as to have an inclined plane that widens in the upward direction, as shown in the figure. By having such tapered hole 16, the tip face 10 of the suction nozzle 8 can be easily guided into the component-accommodating recess 4 of the carrier tape 2.

Preferably, the gap between the carrier tape 2 and the push cover 14 is small, an appropriate size of which is about 10 µm in regards to the accuracy and maintenance of the assembly.

The suction nozzle 8 takes suction on and holds the chip component 6 to the suction face 10 thereof at one place, is transported to position P, and is lowered in a vertical direction or in an up-and down direction at position P, thereby inserting the chip component 6 into the component-accommodating recess 4. After insertion, the suction nozzle 8 is raised in the vertical direction and is transported to another place to pick up a new chip component. An example of such transporting mechanism of the suction nozzle 8 is a mechanism having displacing means for displacing the suction nozzle 8 in a horizontal direction between one place above position P and another place above the other one or more positions, and elevating means for moving the suction nozzle 8 in the up-and-down direction at position P. The transporting mechanism can be of any other kind.

The transporting mechanism of the suction nozzle 8 can be made especially for the chip-component accommodating device. Alternatively, if the chip-component accommodating device is built into another apparatus, for example, an examining apparatus, the suction nozzle in such apparatus can also be used as the suction nozzle of the chip-component accommodating device, and can also be used with the transporting mechanism in the apparatus.

There may only be one suction nozzle 8, or there may be a plurality of suction nozzles, operating so as to sequentially insert the chip components into the carrier tape 2. With respect to high-speed operation, multiple suction nozzles 8 are preferably provided.

Now, the operation of the chip-component accommodating device of the present embodiment will be explained with reference to FIG. 1A through FIG. 1D.

The suction nozzle 8 is displaced to a place above the component-accommodating recess 4 of the carrier tape 2 with the chip component 6 held by negative pressure to the tip face 10 of the suction nozzle 8, and then is lowered (FIG. 1A).

Figure 1B:
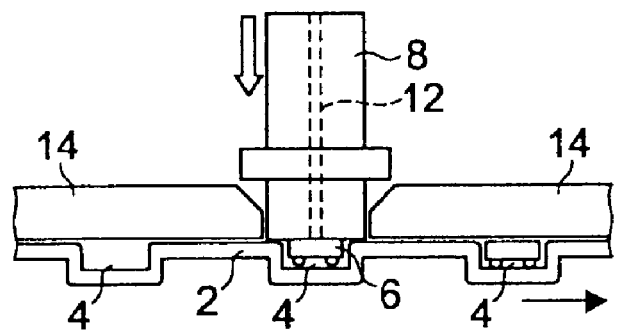
Figure 1C:
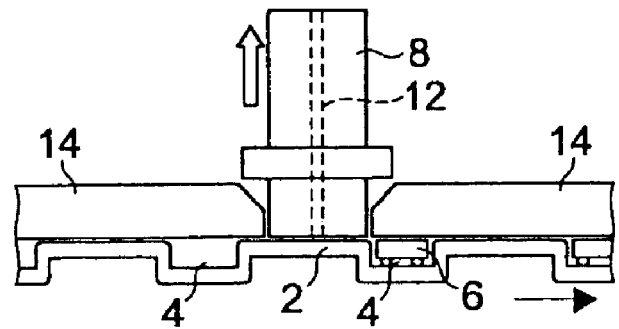

After the chip component 6 enters the component-accommodating recess 4 of the carrier tape 2, suction of the suction nozzle 8 is released (FIG. 1B). When suction is released, the chip component 6 is dropped into the component-accommodating recess 4 and the carrier tape 2 starts to move in the direction shown with an arrow. Since the upper surface of the chip component 6 is pressed down with the push cover 14 and the tip face 10 of the suction nozzle 8, the chip component 6 is placed under the push cover 14 without falling out of the component-accommodating recess 4 (FIG. 1C).

Figure 1D:
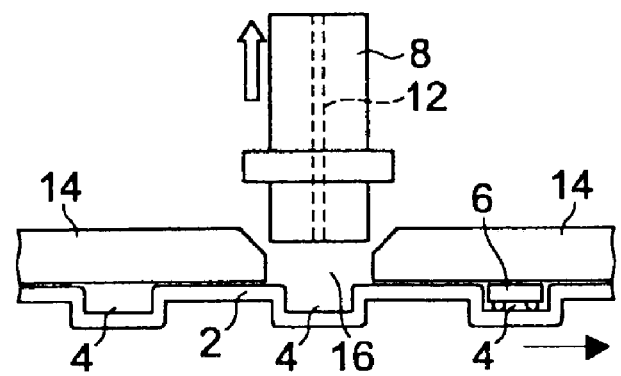

When the opening of the component-accommodating recess 4 is completely under the push cover 14, the suction nozzle 8 is raised (FIG. 1D). Here, even if some of the negative pressure is still left in the suction hole 12 of the suction nozzle 8, the chip component 6 will not be mistakenly taken out of the component-accommodating recess 4 or be moved out of the normal position because the chip component 6 is already under the push cover 14.

The suction nozzle 8 is raised to a predetermined position and is moved to the next process.

Here, although not shown in the figure, after the chip component 6 is accommodated in the carrier tape 2, a covering tape is placed over the carrier tape 2 at another position so as to cover the component-accommodating recess 4. The covering tape is melted and attached to the carrier tape by thermo-compression bonding thus sealing the chip component 6 inside the component-accommodating recess 4. The carrier tape 2 and the covering tape are made of resin material such as polyethylene so as to be thermo-compression bondable. Furthermore, although not shown in the figure, equally spaced feeding holes are provided in the longitudinal direction of the tape carrier so that the tape carrier can be fed with good control.

Figure 2:
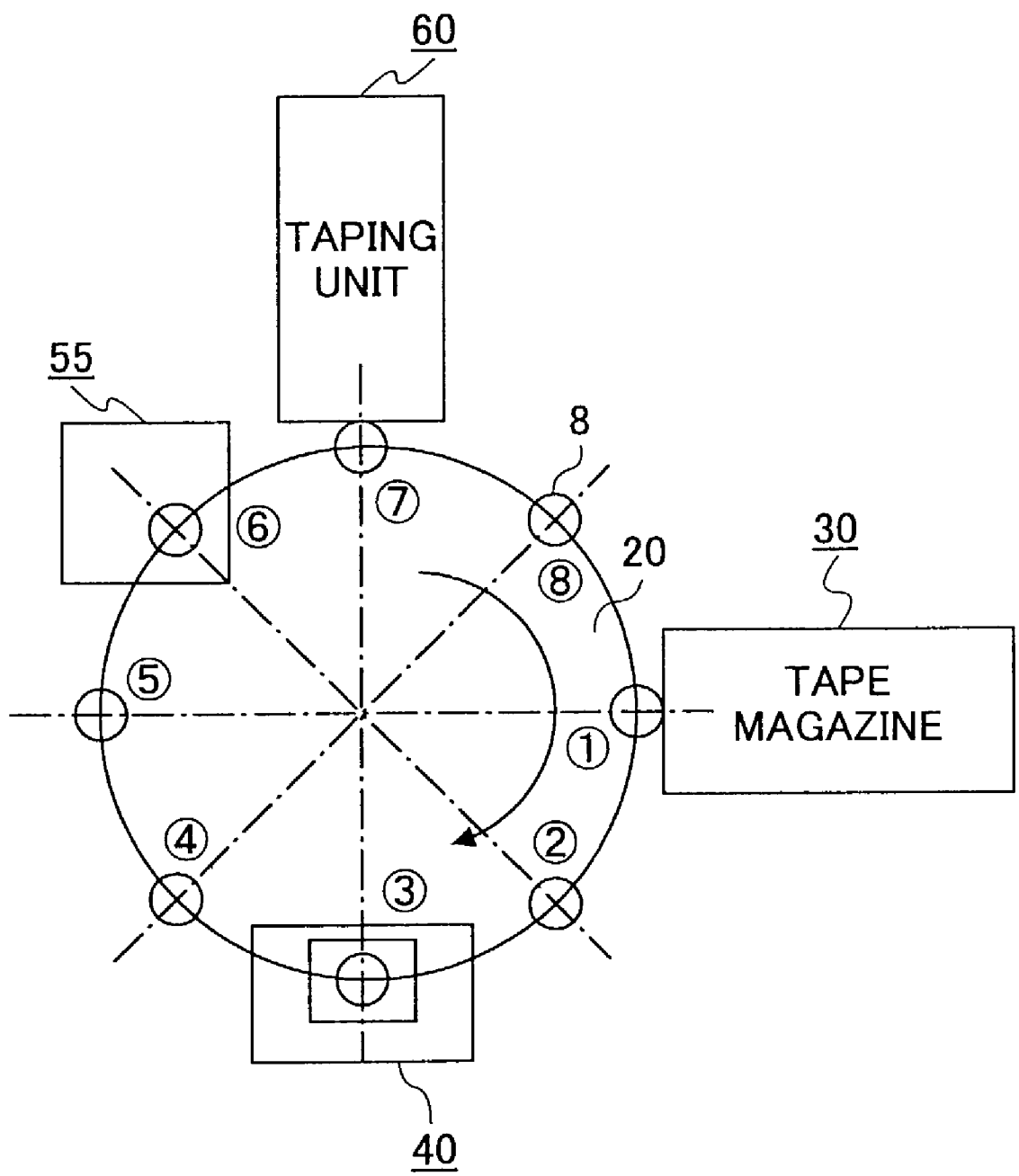
FIG. 2 is a schematic top view according to one embodiment of a chip-component examining apparatus of the present invention.
Figure 3:
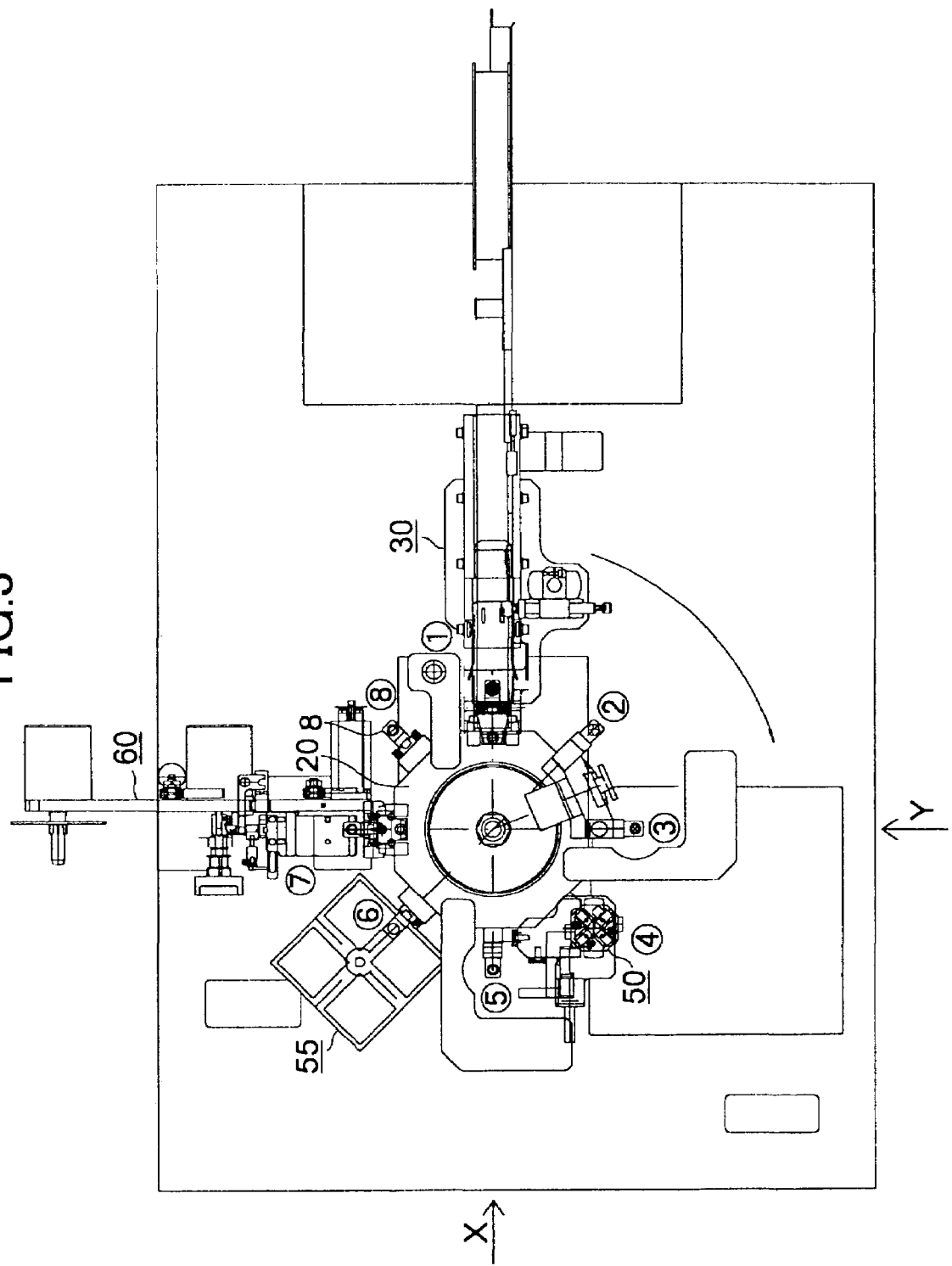
FIG. 3 is a detailed top view of the embodiment of FIG. 2.

Now, one embodiment of the chip-component examining apparatus will be explained with reference to FIG. 2 through FIG. 5, which apparatus has the chip-component accommodating device of the embodiment shown in FIG. 1 as a packing section for accommodating the chip component that has undergone examination. FIG. 2 is a schematic top view, FIG. 3 is a top view, FIG. 4 is a front view seen from the Y direction in FIG. 3, and FIG. 5 is a side view seen from the X direction in FIG. 3.

Reference number 20 depicts a rotor, and in a plane, eight equally divided stages or positions ①–⑧ are arranged along the circumference of the rotor. On the rotor 20, suction nozzles 8 are provided on each of the eight equally divided positions on a common circumference from the rotation center. The suction nozzle 8 is also used as a suction nozzle 8 of the embodiment shown in FIG. 1. The rotor 20 rotates in a clockwise direction in the plane as shown with an arrow, and is intermittently driven so that the suction nozzle 8 sequentially stops at each of the eight stages ①–⑧.

Figure 4:
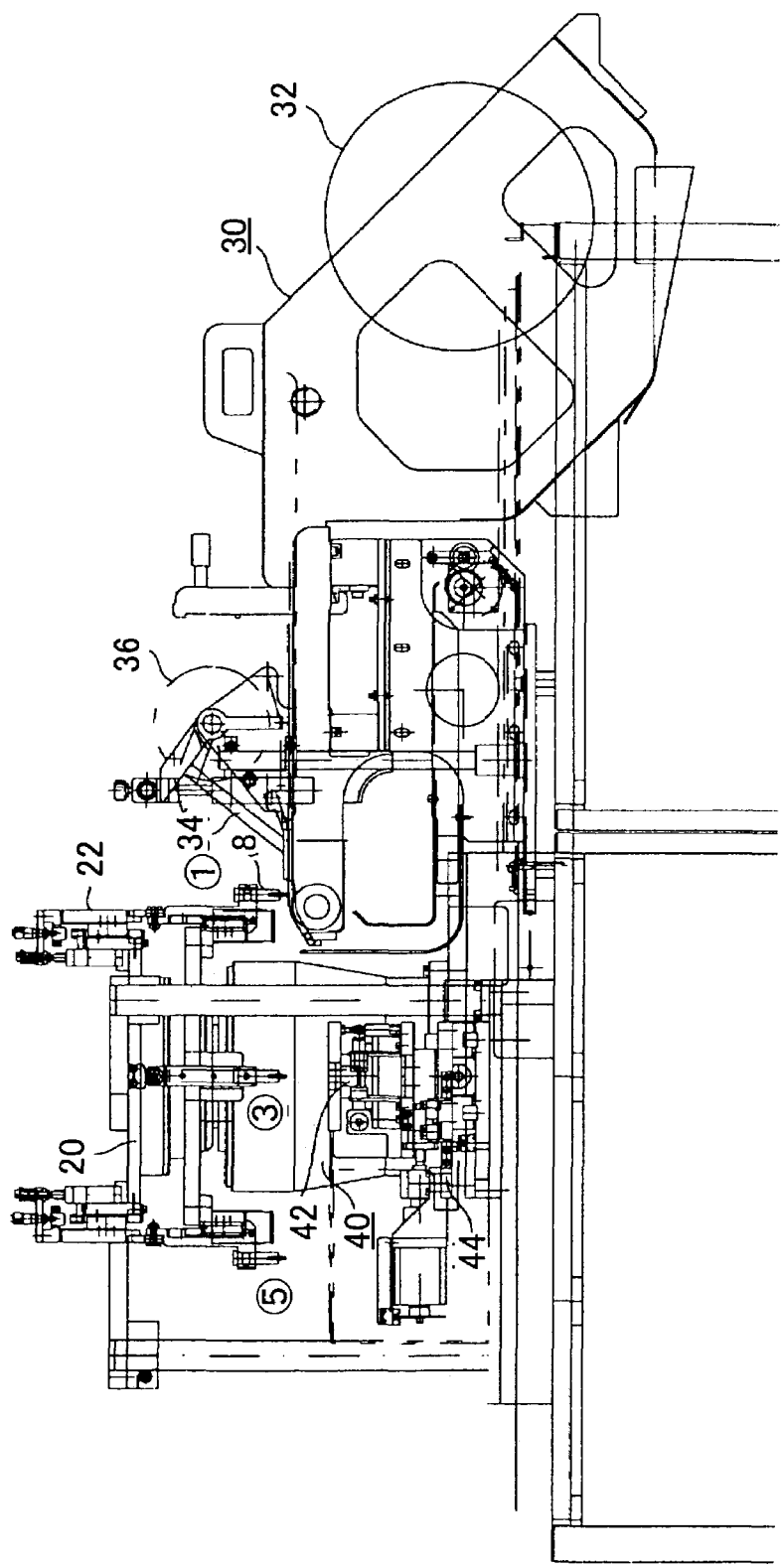
FIG. 4 is a front view as seen from the Y direction in FIG. 3.
Figure 5:
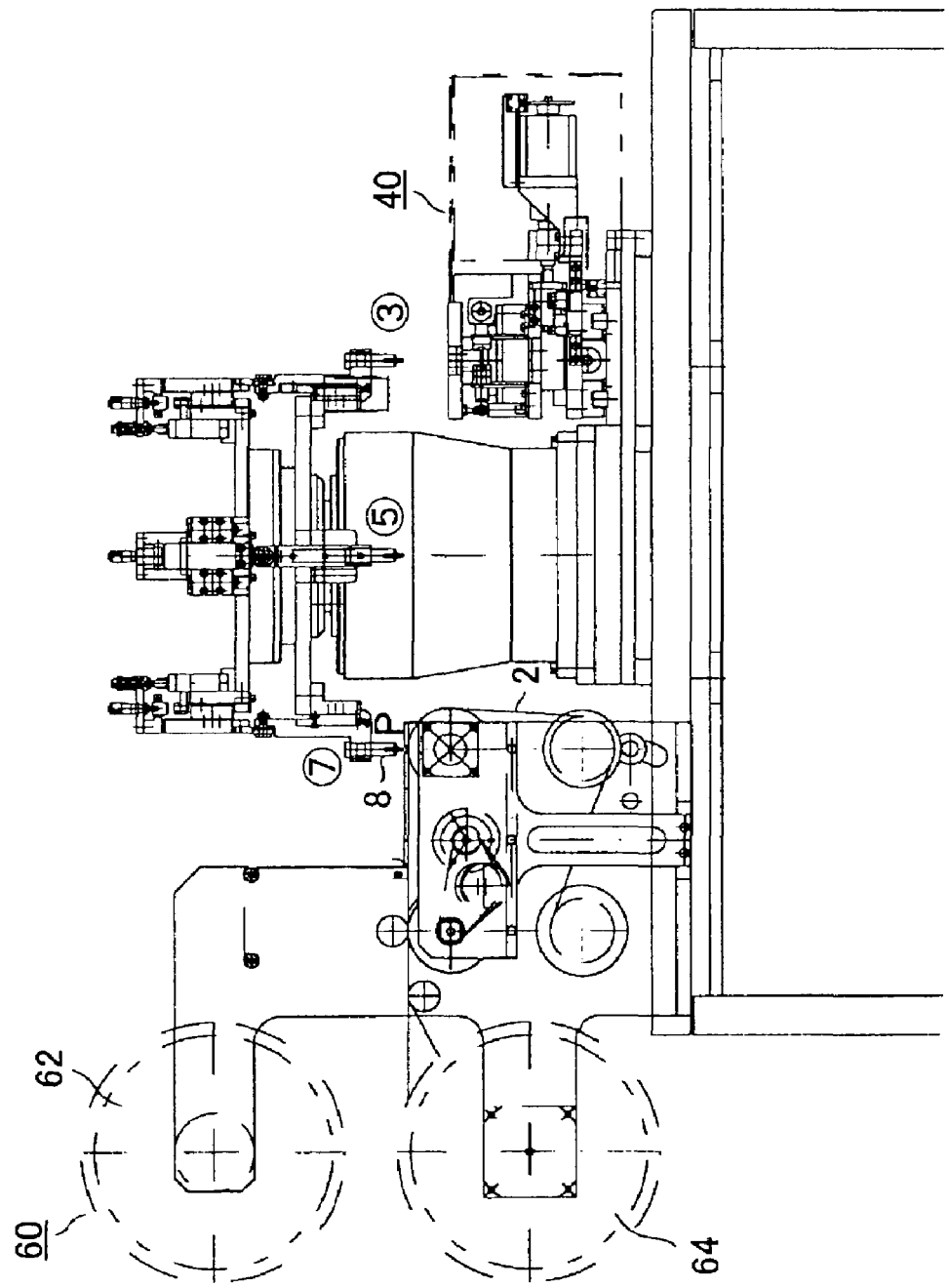
FIG. 5 is a side view as seen from the X direction in FIG. 3.
Figure 6A:
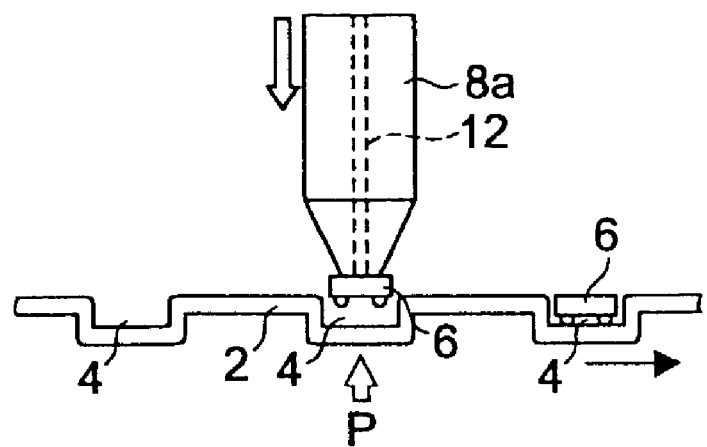
FIG. 6A and FIG. 6B are diagrams showing a main part of a conventional automatic packaging device in the order of operation thereof.
Figure 6B:
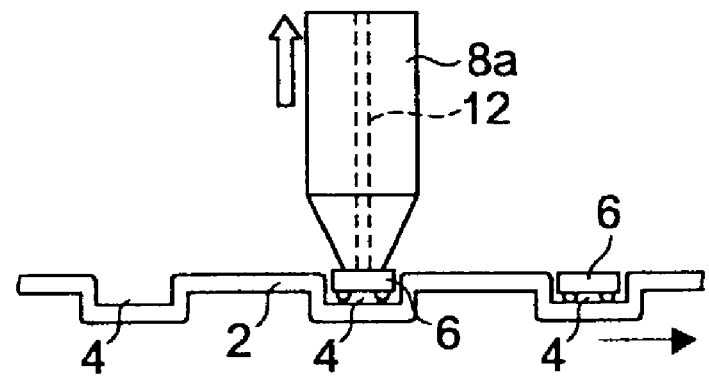

The suction nozzle 8 is attached through elevating mechanism 22 so as to be movable in the up-and-down direction or in the vertical direction with respect to the rotor 20, as shown in FIG. 4 and FIG. 5. The rotor 20 temporarily stops when the suction nozzle 8 reaches any one of the positions ①–⑧. The suction nozzle 8 is then lowered by the elevating mechanism 22, and then, after a predetermined process, is raised to the original position. Thereafter, the rotor 20 again rotates and the suction nozzle 8 is transported to the next stage.

Although not shown in the figure, each of the suction nozzles 8 is connected to a suction pump and can be switched between the suction state and the discharge state by the solenoid valve.

At stage ①, a tape magazine is provided as a supplying section for sequentially supplying the chip component to be examined. The chip component to be examined is accommodated in the respective component-accommodating recess of the carrier tape formed by embossing, and is sealed by a covering tape. The carrier tape that has accommodated the chip component to be examined is attached to one part of the tape magazine 30 while being wound to the reel 32, as shown in FIG. 4. The carrier tape is pulled out of the reel 32 and is intermittently fed in a direction of stage ① with the covering tape facing up. The position at which the suction nozzle 8 is lowered in stage ① is the component supplying position. The covering tape 34 is stripped off just before the relevant component supplying position and is wound to another reel 36. The covering tape 34 is merely melted and attached to the carrier tape by thermo-compression bonding, and thus is easily removed. The chip component to be examined is placed in the component-accommodating recess of the carrier tape, with the covering tape 34 removed, and is transported to the component supplying position of stage ① with the upper part thereof opened. At the component supplying position, the suction nozzle 8 is lowered to the chip component and the chip component is adhered by the negative pressure to the suction face of the tip of the suction nozzle 8. The suction nozzle 8 is then raised by the elevating mechanism 22. The carrier tape, after the chip component is taken out therefrom, is wound by a reel attached to a different part of the tape magazine.

In this embodiment, a chip size package semiconductor device having, as electrodes, solder ball terminals on the back surface thereof is considered as a chip component or a component to be examined. In stage ①, the back side of the chip component is attached to the suction face of the suction nozzle so that the surface provided with ball terminals is facing down.

In stage ②, although not shown in the figure, a positioning sensor is arranged for detecting the position of the ball terminal of the chip component from under the ball terminal. This positioning sensor is equipped with, for example, a CCD camera and other imaging devices, and detects the position of the imagined ball terminal by image processing.

In stage ③, as shown in FIG. 4, an examining section 40 is arranged for examining the electrical properties of the chip component by contacting the ball terminal of the chip component while the chip component is attached to the suction nozzle 8. A probe card 42 provided with a probe that contacts the ball terminal of the chip component is mounted on the examining section 40. The probe card 42 is placed on the XYZ stage 44. The XYZ stage 44, based on the position of the ball terminal of the chip component detected by the positioning sensor in stage ②, adjusts the front and back position, and the left and right position of the probe card 42 so that the tip of the probe of the probe card 42 and the ball terminal of the chip component contact each other properly when the suction nozzle 8 is lowered with the chip component adhered thereto in stage ③. The XYZ stage 44 can also adjust the height of the probe card 42, if necessary.

In stage ④, a position correcting mechanism 50 is provided for correcting the position of the chip component attached to the suction nozzle 8, as shown in FIG. 3. The position correcting mechanism 50 determines the position of the chip component based on the position of the ball terminal of the chip component detected by the positioning sensor in stage ②. If the position deviates to an extent unsuitable for the chip component to be accommodated into the carrier tape in packing section 60 explained hereinafter, the position of the chip component is mechanically corrected by laterally applying a force to the chip component.

In stage ⑤, no particular process is carried out, but it is provided as a spare stage so as to enable an additional process to be carried out, if necessary.

In stage ⑥, a non-defective/defective sorting section 55 is provided. When the chip component is determined to be defective as a result of the examination in stage ③, suction on the suction nozzle 8 is released at this non-defective/defective sorting section 55, and the defective chip component is discarded.

In stage ⑦, as shown in FIG. 5, a packing section 60 is provided for packing the chip component to the carrier tape, which chip component is determined to be non-defective as a result of the examination and has the suction position thereof corrected in stage ④. The packing section 60 is the chip-component accommodating device explained in the embodiment shown in FIG. 1. In the chip-component accommodating device 60, the carrier tape 2 supplied from the reel is intermittently fed and sent to the inserting position P of the chip component. At position P, the suction nozzle 8 is lowered and the chip component is inserted into the component-accommodating recess 4 of the carrier tape 2. Suction is then released and the component is accommodated in the component-accommodating recess 4. The details of the main part thereof are as shown in the embodiment of FIG. 1.

Above the carrier tape 2 to which the chip component is accommodated, a covering tape is supplied from the reel 62 to cover the component-accommodating recess 4. The carrier tape 2 and the covering tape 62 are melted and attached by thermo-compression bonding, thus sealing the chip component inside the component-accommodating recess 4. Thereafter, the carrier tape 2 is wound by the reel of the winding section 64.

Stage ⑧ is also not used for a particular process, as with stage ⑤, but is provided as a spare stage so as to enable additional process to be carried out, if necessary.

Now, the operations of the embodiment of the chip-examining apparatus will be explained.

The chip component to be examined is attached to the tape magazine 30 and is supplied while being sealed to the carrier tape and wound to the reel 32. The back side of the chip component to be examined is held by the suction face of the suction nozzle 8 so that the surface provided with ball terminals is facing down, in the component supplying position of stage ①.

When the rotor 20 is rotated 45°, the chip component to be examined is moved to stage ②, and the position of the ball terminal of the chip component to be examined is detected by the positioning sensor.

When the rotor 20 is further rotated 45°, the chip component to be examined is moved to stage ③, and the electrical properties of the chip component to be examined are examined by the examining section 40.

When the rotor 20 is further rotated 45°, the chip component to be examined is moved to stage ④, and the position of the chip component to be examined is corrected by the position correcting mechanism 50 based on the position of the ball terminal of the chip component to be examined detected by the positioning sensor in stage ②.

When the rotor 20 is further rotated 45°, the chip component to be examined is moved to stage ⑤, but no particular process is carried out in this stage.

When the rotor 20 is further rotated 45°, the chip component to be examined is moved to stage ⑥, and the chip component determined to be defective as a result of the examination in stage ③ is discarded.

When the rotor 20 is further rotated 45°, the chip component to be examined is moved to stage ⑦, and the chip component determined to be non-defective and attached to the suction nozzle 8 is accommodated into the carrier tape 2 at the packing section 60.

When the rotor 20 is further rotated 45°, the suction nozzle 8 is moved to stage ⑧, but no particular process is carried out in this stage.

When the rotor 20 is further rotated 45°, the suction nozzle 8 is moved to stage ① and a new chip component to be examined is picked up.

Although the above operation is explained with respect to sequentially tracking one suction nozzle 8, eight chip components to be examined held by eight suction nozzles 8 can be processed simultaneously at every rotation of 45° of the rotor 20, and those components determined to be non-defective can be sequentially accommodated in the carrier tape 2.

One feature of the chip-component accommodating device according to the present invention is that because the size of the suction face of the tip of the suction nozzle that inserts the chip component into the accommodating recess is made larger than the size of the chip component, and because a cover having an opening of a size that covers the upper part of the opening of the component-accommodating recess with the tip face of the suction nozzle at the inserting position of the chip component is provided, by moving the carrier tape with the upper part of the chip component covered with the tip face of the suction nozzle and the cover, the chip component will not fall out of the component-accommodating recess of the carrier tape or deviate from the normal position even if the carrier tape is moved before the negative pressure of the suction nozzle is completely gone, thus enabling a reliable insertion of the component.

Furthermore, in comparison to the conventional device, it is only necessary to add a cover and there is no need for a high-accuracy component or a sophisticated assembling technique, and increase in the cost of the device can be more or less avoided.

Moreover, after the negative pressure of the suction nozzle is released, there is no need to wait until all of the negative pressure is completely gone to move the carrier tape, thus greatly saving packaging time.

The chip-component examining apparatus according to the present invention has the chip-component accommodating device of the present invention in the packing section for sequentially accommodating the chip components that have undergone examination, and thus the chip components that have undergone an examination can be packed securely and rapidly, and the chip-component packing process will not be the bottleneck process controlling the operation speed of the entire examining apparatus.

The present invention is not limited to these embodiments, but variations and modifications may be made without departing from the scope of the present invention.

What is claimed is:

1. A chip-component accommodating apparatus for intermittently feeding a carrier tape forming a plurality of equally spaced component-accommodating recesses while sequentially inserting a chip component into each of said component-accommodating recesses, and then after said chip component is inserted, sealing the upper surface of said carrier tape, said apparatus comprising:
    a suction nozzle, provided with a suction face that removably picks up said chip component using vacuum suction, for inserting said chip component into said component-accommodating recess, the size of said suction face being greater than the size of said chip component;
    a transporting mechanism transporting said suction nozzle to a chip inserting position; and
    a cover member provided in close proximity to the upper surface of said carrier tape and near said chip inserting position, said cover member of said chip-component accommodating apparatus comprising an opening forming part and having a size that covers, together with said suction face of said suction nozzle, the upper part of said component-accommodating recess.

2. The apparatus as claimed in claim 1; wherein said apparatus further comprises:
    a control device for controlling the operation of said suction nozzle, the operation of said transporting mechanism, and the feeding operation of said carrier tape.

3. The apparatus as claimed in claim 1; wherein said suction nozzle, said transporting mechanism, and said carrier tape operate so that after said suction nozzle is lowered and said suction face of said suction nozzle enters said opening forming part of said cover member thus inserting said chip component into said component-accommodating recess, said vacuum suction of said suction nozzle is released and said carrier tape starts to be intermittently fed.

4. The apparatus as claimed in claim 3; wherein said suction nozzle, said transporting mechanism, and said carrier tape operate so that after said carrier tape starts to be intermittently fed, and after said component-accommodating recess of said carrier tape passes said opening forming part of said cover member, said suction nozzle is raised.

5. The apparatus as claimed in claim 1; wherein said opening forming part of said cover member is a hole forming pan, the size of said hole forming part being set so as to enable said suction face of said suction nozzle to enter.

6. The apparatus claimed in claim 1; wherein said opening forming part of said cover member has an inclined plane where the upper edge of said opening forming part widens in the upward direction away from said component-accommodating recess.

7. The apparatus as claimed in claim 1; wherein the size of the suction face of said suction nozzle is larger than the size of said component-accomodating recess in the traveling direction of the carrier tape.

8. The apparatus as claimed in claim 1; wherein said transporting mechanism comprises:
    a displacing mechanism displacing said suction nozzle to a place above said inserting position of the chip component; and
    an elevating mechanism moving said suction-nozzle in the up-and-down direction orthogonal to the traveling direction of the carrier tape at said inserting position of the chip component.

9. The apparatus as claimed in claim 1; wherein a plurality of sets of said transporting mechanisms and said suction nozzles are provided, and chip components are simultaneously inserted from said plurality of suction nozzles into said plurality of said component-accommodating recesses formed sequentially in said carrier tape, which carrier tape is intermittently fed.

10. A chip-component examining apparatus comprising:
    a supplying section sequentially supplying a chip component to be examined;
    an examining section examining electrical properties of said supplied chip component;
    a packing section sequentially accommodating said chip component that has undergone the examination; and
    a mechanism sequentially transporting said chip component to be examined between each of said supplying, examining and packing sections;

wherein a chip-component accommodating device is provided in said packing section, wherein the chip-component accommodating device intermittently feeds a carrier tape forming a plurality of equally spaced component-accommodating recesses while sequentially inserting a chip component into each of said component-accommodating recesses, and then after said chip component is inserted, scaling the upper surface of said carrier tape, and wherein die chip-component accommodating device includes:
  a suction nozzle, provided with a suction face that removably picks tip said chip component using vacuum suction, for inserting said chip component into said component-accommodating recess, the size of said suction face being greater than the size of said chip component;
  a transporting mechanism transporting said suction nozzle to a chip inserting position; and
  a cover member provided in close proximity to the upper surface of said carrier tape and near said chip inserting position, said cover member of said chip-component accommodating device comprising an opening forming part end having a size that covers, together with said suction face of said suction nozzle, the tipper part of said component-accommodating recess.

11. The chip-component examining apparatus as claimed in claim 10; wherein
  said mechanism sequentially transporting said chip component to be examined comprises a rotor that rotates in a plane, and a suction nozzle that removably picks up said chip component and that is being supported by said rotor so as to be movable in an up-and-down direction; and
  each of said sections is arranged along the circumference of said rotor.

12. The chip-component examining apparatus as claimed in claim 11; wherein
  a plurality of said suction nozzles are arranged equally spaced from each other along the circumference of said rotor; and
  each of said sections are arranged in one of the positions equally spaced along the circumference of said rotor, where the number of said positions is the same as the number of said suction nozzle.

13. The chip-component examining apparatus as claimed in claim 11, wherein the suction nozzle provided on said rotor is also used as the suction nozzle in said chip-component accommodating device.

14. The chip-component examining apparatus as claimed in claim 10; wherein a non-defective/defective sorting section for discarding the chip component determined to be defective based on the examination result of said examining section is provided in one of the positions to where said chip component to be examined is transported; and
  said packing section only accommodates the chip component determined as non-defective.

15. The chip-component examining apparatus as claimed in claim 10; wherein an orientation detecting mechanism for detecting the orientation of the chip component picked up by the suction nozzle is provided in one of the positions to where the chip component to be examined is transported; and
  a correcting mechanism for correcting the orientation of said chip component detected by said orientation detecting mechanism to an orientation suitable for being accommodated to the component-accommodating recess of said carrier tape is provided in another one of the positions to where the chip component to be examined is transported.

16. The chip-component examining apparatus as claimed in claim 15; wherein said chip component to be examined comprises a ball terminal on the undersurface;
  said suction nozzle picks up said chip component so that the surface provided with said ball terminal is facing down; and
  the orientation of said chip component is detected in said orientation detecting mechanism based on the position of said ball terminal.

17. The chip-component examining apparatus as claimed in claim 15; wherein said chip component to be examined comprises a ball terminal on the undersurface;
  said suction nozzle picks up said chip component so that the surface provided with the ball terminal is facing down;
  the position of the ball terminal is detected in said orientation detecting mechanism; and
  said examining section is provided with a probe that contacts said ball terminal to examine the electrical properties of said chip component, and a probe position correcting mechanism for correcting the position of said probe so as to correspond to the position of said ball terminal detected in said orientation detecting mechanism.

18. The apparatus as claimed in claim 1, wherein said opening forming part includes an opening in said cover member through which said chip component held by said vacuum suction of said suction nozzle is lowered to insert said chip component into said component-accommodating recess.

* * * * *